(12) United States Patent
Yamabuchi et al.

(10) Patent No.: US 11,066,742 B2
(45) Date of Patent: Jul. 20, 2021

(54) VAPOR DEPOSITION MASK

(71) Applicant: Sharp Kabushiki Kaisha, Sakai (JP)

(72) Inventors: Koji Yamabuchi, Sakai (JP); Masao Nishiguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 33 days.

(21) Appl. No.: 16/471,590

(22) PCT Filed: Sep. 28, 2017

(86) PCT No.: PCT/JP2017/035195
§ 371 (c)(1),
(2) Date: Jun. 20, 2019

(87) PCT Pub. No.: WO2019/064420
PCT Pub. Date: Apr. 4, 2019

(65) Prior Publication Data
US 2020/0385856 A1    Dec. 10, 2020

(51) Int. Cl.
*C23C 16/04* (2006.01)
*H01L 51/00* (2006.01)
*H01L 51/56* (2006.01)

(52) U.S. Cl.
CPC ........ *C23C 16/042* (2013.01); *H01L 51/0011* (2013.01); *H01L 51/56* (2013.01)

(58) Field of Classification Search
CPC ................... C23C 16/042; H01L 51/0011
See application file for complete search history.

(56) References Cited

U.S. PATENT DOCUMENTS

| | | | |
|---|---|---|---|
| 6,878,209 B2* | 4/2005 | Himeshima | H01L 27/3283 118/720 |
| 7,704,326 B2* | 4/2010 | Hagiwara | H01L 51/0011 118/720 |
| 2004/0020435 A1 | 2/2004 | Tsuchiya et al. | |
| 2006/0222965 A1* | 10/2006 | Tsuruko | C23F 1/02 430/5 |
| 2011/0139069 A1* | 6/2011 | Ahn | C23C 14/042 118/504 |
| 2012/0156812 A1* | 6/2012 | Ko | C23C 14/042 438/22 |
| 2012/0174863 A1* | 7/2012 | Park | C23C 14/12 118/504 |
| 2012/0279444 A1 | 11/2012 | Hong | |

(Continued)

FOREIGN PATENT DOCUMENTS

| CN | 105821373 A | 8/2016 |
|---|---|---|
| JP | 2003-332057 A | 11/2003 |

(Continued)

OTHER PUBLICATIONS

Official Communication issued in International Patent Application No. PCT/JP2017/035195, dated Dec. 5, 2017.

*Primary Examiner* — Keath T Chen
(74) *Attorney, Agent, or Firm* — Keating & Bennett, LLP

(57) ABSTRACT

A first region of a valid portion formed on a mask sheet has a shape corresponding to a shape of each of active regions and provided for each active region of a vapor target substrate. A second region of the valid portion is located outside of the first region, and includes a plurality of vapor deposition holes (H) covered with a hauling sheet.

6 Claims, 18 Drawing Sheets

(56) References Cited

U.S. PATENT DOCUMENTS

| | | | | |
|---|---|---|---|---|
| 2012/0279445 A1* | 11/2012 | Kim | ................... | C23C 14/042 |
| | | | | 118/504 |
| 2014/0331926 A1* | 11/2014 | Kim | ................... | C23C 14/042 |
| | | | | 118/504 |
| 2016/0079532 A1* | 3/2016 | Yi | ................... | C23C 14/042 |
| | | | | 438/758 |
| 2016/0122860 A1* | 5/2016 | Kim | ................... | C23C 14/042 |
| | | | | 118/505 |
| 2017/0092862 A1* | 3/2017 | Obata | ................... | B05D 1/32 |

FOREIGN PATENT DOCUMENTS

| | | |
|---|---|---|
| JP | 2012-132096 A | 7/2012 |
| JP | 2012-233250 A | 11/2012 |

\* cited by examiner

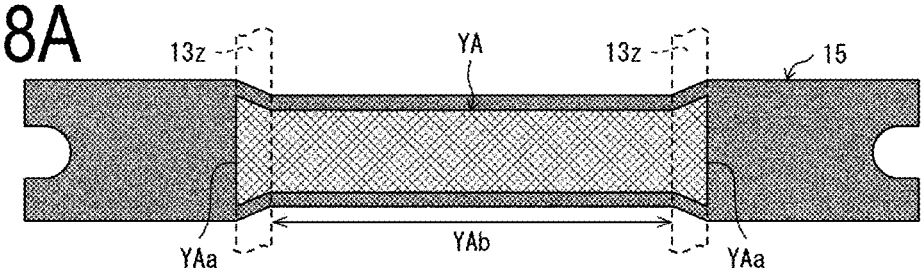
FIG. 8A
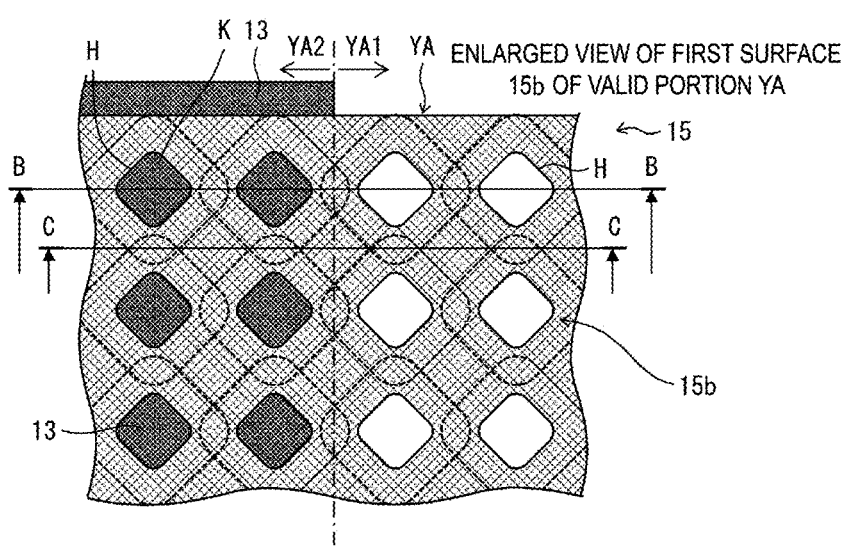
FIG. 8B
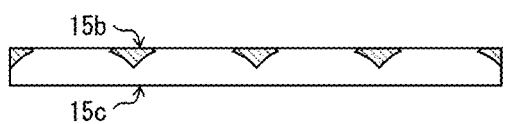
FIG. 8C CROSS SECTION B-B
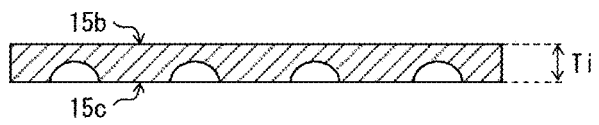
FIG. 8D CROSS SECTION C-C

VAPOR DEPOSITION MASK

TECHNICAL FIELD

The disclosure relates to a vapor deposition mask and a method for manufacturing the vapor deposition mask.

BACKGROUND ART

As described in PTL 1, a vapor deposition mask is used in the case of patterning and forming a light-emitting layer on each pixel in an organic EL display device.

At the time of preparing the vapor deposition mask, while both end portions of a plurality of mask sheets 115 each having a strip shape are stretched (pulled) outward as indicated by arrows F4 in FIG. 18, portions at or near both the end portions are welded to a mask frame.

The mask sheets 115 each have a plurality of valid portions YAZ formed. The valid portions YAZ are regions in which a plurality of vapor deposition holes for vapor depositing a vapor-deposition layer for each pixel of a vapor target substrate are formed to be arranged.

In an example in FIG. 18, the valid portions YAZ each have a shape corresponding to a shape of an active region of the vapor target substrate.

Since the plurality of vapor deposition holes corresponding to the pixels are formed in the valid portions YAZ of each of the mask sheets 115 as described above, the mask sheets 115 particularly need to have relative positional accuracy with respect to a mask frame.

CITATION LIST

Patent Literature

PTL 1: JP 2012-132096 A

SUMMARY

Technical Problem

A plurality of vapor deposition holes are formed in a mesh form in a region of a mask sheet 115 in which valid portions YAZ are formed, and hence, the region has rigidity lower than rigidity of a region outside the valid portions YAZ.

Hence, in the case where both ends of the mask sheet 115 are stretched outward to attach the mask sheet 115 to a mask frame, a width W115b in a portion at or near the center 115b of each of the valid portions YAZ of the mask sheet 115 is more likely to be small than a width W115a of a region 115a between the valid portions YAZ.

As described above, since nonuniform stress occurs in the mask sheet 115 at the time of stretching the mask sheet 115, accuracy of a relative position between the vapor deposition holes and the mask frame deteriorates, and as a result, there has been a problem of deterioration in positional accuracy with which a vapor-deposition layer is patterned and formed.

The disclosure has been made in view of the above-described problems of the related art, and an object of the disclosure is to provide a vapor deposition mask that can be used for patterning and forming a vapor-deposition layer with high accuracy.

Solution to Problem

To solve the problems described above, vapor deposition mask according to one aspect of the disclosure provide a vapor deposition mask configured to be used to vapor-deposit a vapor-deposition layer on each of pixels of a vapor target substrate provided with a plurality of active regions on which the pixels contributing to displaying are arranged, the vapor deposition mask including: a mask sheet provided with a valid portion extending across the plurality of active regions and including a plurality of vapor deposition holes formed to be arranged; and a plurality of hauling sheets configured to support the mask sheet, wherein the valid portion includes a first region and a second region, the first region has a shape corresponding to a shape of each of the plurality of active regions, and is provided for each of the plurality of active regions, and the second region defines a shape of the first region, and overlaps with the plurality of hauling sheets to cause a portion of the plurality of vapor deposition holes to be covered.

To solve the problems described above, a method for manufacturing a vapor deposition mask according to one aspect of the disclosure provides a method for manufacturing a vapor deposition mask configured to be used to vapor-deposit a vapor-deposition layer on each of pixels of a vapor target substrate provided with a plurality of active regions on which the pixels contributing to displaying are arranged, the method including: a vapor-deposition-hole forming step for forming a plurality of vapor deposition holes in a mask sheet and providing a valid portion extending across a plurality of the active regions; a hauling-sheet attachment step for attaching a plurality of hauling sheets to a mask frame; and a mask-sheet attachment step for attaching the mask sheet to the mask frame to cause the mask sheet to overlap with the plurality of hauling sheets and to be supported by the plurality of hauling sheets, and providing a first region and a second region in the valid portion, wherein the first region is a region having a shape corresponding to a shape of each of the plurality of active regions, and being provided for each of the plurality of active regions, and the second region is a region defining a shape of the first region, and overlapping with the plurality of hauling sheets to cause a portion of the plurality of vapor deposition holes to be covered.

Advantageous Effects of Disclosure

According to an aspect of the disclosure, an effect in which a vapor deposition mask that can be used for patterning and forming a vapor-deposition layer with high accuracy can be provided.

BRIEF DESCRIPTION OF DRAWINGS

FIGS. 8A to 8D are views each illustrating a configuration of a mask sheet according to the first embodiment.

DESCRIPTION OF EMBODIMENTS

First Embodiment

Outline of Method for Manufacturing Organic EL Display Panel

Figure 1:
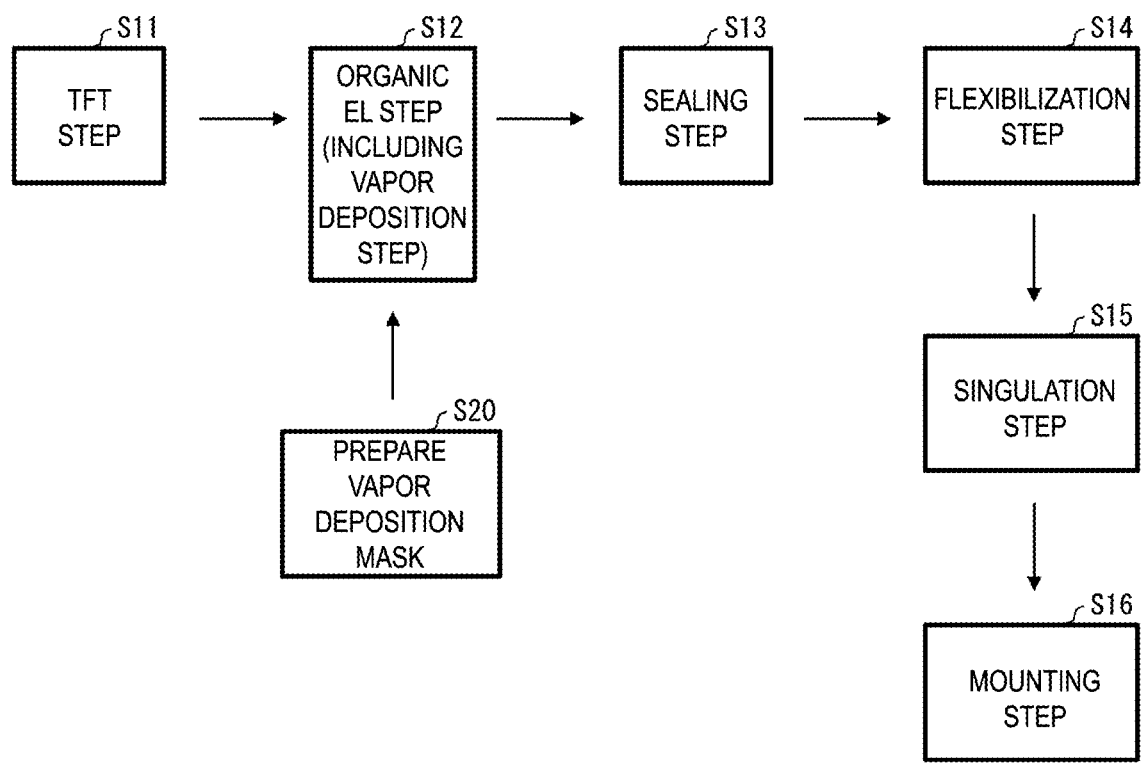
FIG. 1 is a view illustrating manufacturing steps for an organic EL display panel according to a first embodiment.
Figure 2:
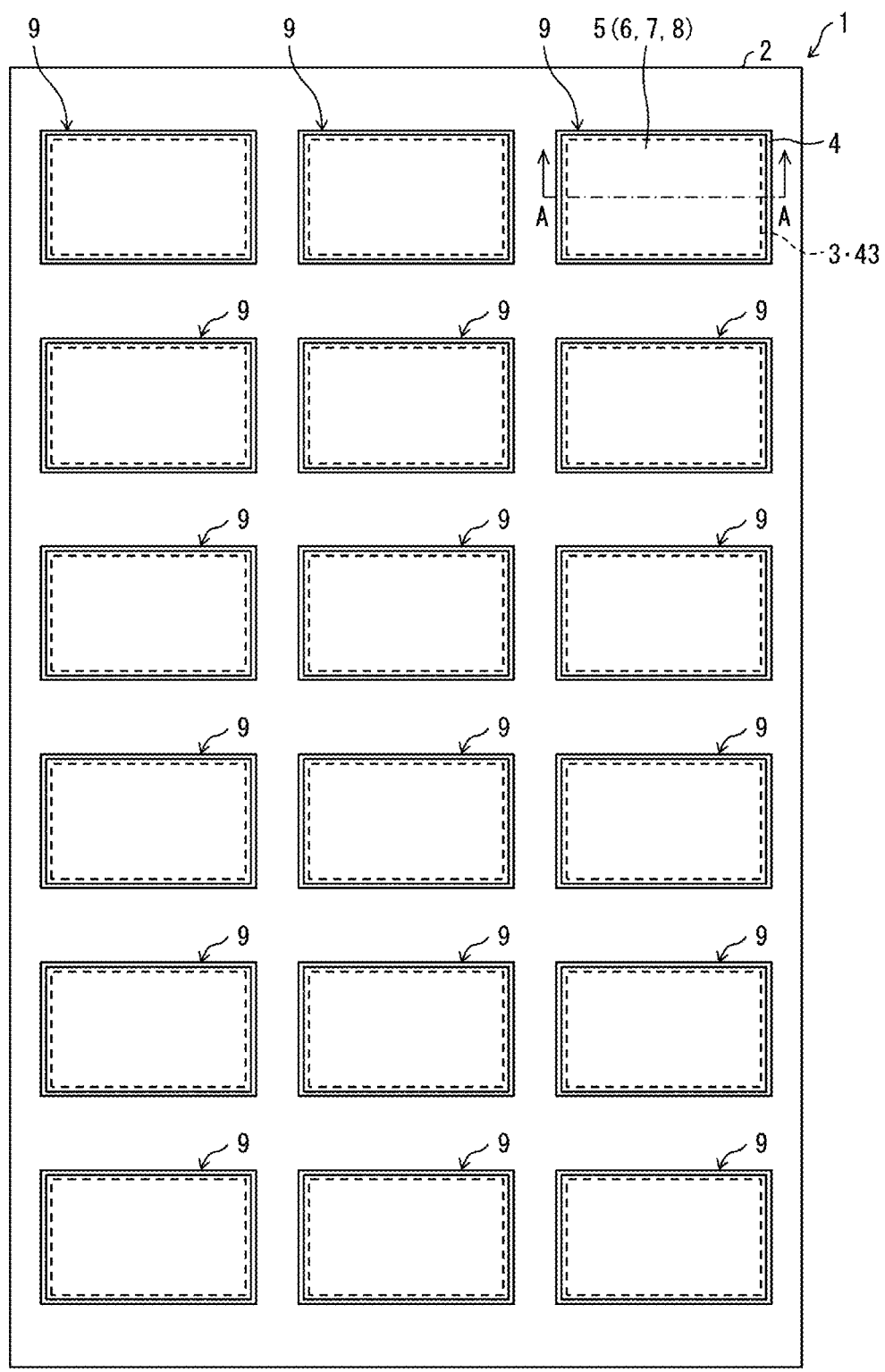
FIG. 2 is a plan view of a substrate of the organic EL display panel according to the first embodiment.
Figure 3:
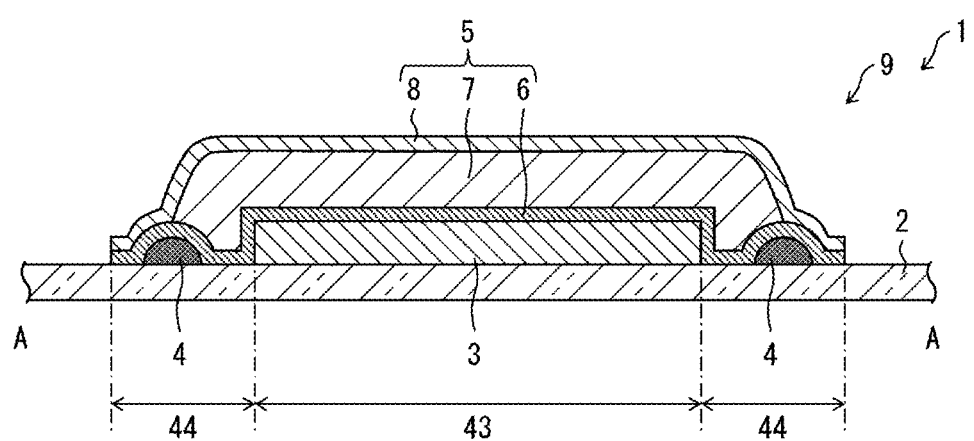
FIG. 3 is a cross-sectional view of an organic EL display panel formation region of the substrate illustrated in FIG. 2.

FIG. 1 is a view illustrating manufacturing steps for an organic EL display panel according to a first embodiment. FIG. 2 is a plan view of a substrate 1 of the organic EL display panel according to the first embodiment of the disclosure. FIG. 3 is a cross-sectional view of an organic EL display panel formation region of the substrate illustrated in FIG. 2. FIG. 3 illustrates a configuration in the case where 18 pieces of organic EL display panels are obtained from one mother glass. Note that the number of the organic EL display panels obtained from one mother glass is not limited to 18, and may be 17 or less or may be 19 or more.

On the substrate 1, 18 pieces of organic EL display panel formation regions 9 are disposed. Each of the organic EL display panel formation regions 9 is a region cut out from the mother glass into an individual piece and then to be an organic EL display panel.

The substrate 1 includes a TFT substrate (vapor target substrate) 2, an active region 3, a frame-shaped bank 4, and a sealing layer 5.

A plurality of the active regions 3 are provided in a matrix shape. The active regions 3 are, for example, regions in which pixels of RGB are formed, respectively. In each of the organic EL display panel formation regions 9, a region where the active region 3 is formed serves as a display region 43, and a peripheral region surrounding the active region 3 serves as a frame region 44. Note that, in FIG. 2, the frame region 44 is a region located outside of a region (active region 3) indicated by a dashed line of the organic EL display panel formation region 9.

As illustrated in FIGS. 1 to 3, the TFT substrate 2 is first prepared at TFT step S11. The TFT substrate 2 is prepared by forming, on the mother glass, a film serving as a base of a flexible substrate by using a material such as polyimide, forming, on the film by a known method, various types of wiring lines present in a pixel circuit provided on each pixel, such as a TFT (a transistor, a driving element), a gate wiring line, and a source wiring line, forming a passivation film (protection film), and an interlayer insulating film (surface leveling film), and the like, and further forming, on the inorganic insulating film, a reflective electrode layer being in contact with an anode, an ITO layer, and a pixel bank (edge cover) for defining a light emitting region.

Accordingly, the light emitting region is formed on the active region 3.

The passivation film prevents peeling of the metal film in the TFT, and protects the TFT. The passivation film is formed on the mother glass or via another layer, and covers the TFT. The passivation film is an inorganic insulating film including silicon nitride, silicon oxide, and the like.

The interlayer insulating film provides a leveled surface over irregularities on the passivation film. The interlayer insulating film is formed on the passivation film. The interlayer insulating film is an organic insulating film made of a photosensitive resin such as acrylic, or made of a thermoplastic resin such as polyimide.

In addition, at the time of forming this active region 3, the frame-shaped bank 4 surrounding the active region 3 in a frame shape is also formed on the TFT substrate 2. The frame-shaped bank 4 is made of a photosensitive resin such as acrylic, or of a thermoplastic resin such as polyimide.

Next, at organic EL step S12, an organic EL layer is formed on the reflective electrode layer in each pixel (namely, in an opening of the pixel bank formed at TFT step S11) of the TFT substrate 2. The organic EL layer includes the light-emitting layer, a hole transport layer, and other function layers. The light-emitting layer emits light of a different color such as red, green, or blue for each pixel. At the vapor deposition step, at least one of the light-emitting layer and the hole transport layer (hereinafter, also referred to as the light-emitting layer or the like) is formed at a predetermined position of each pixel by vapor deposition using the vapor deposition mask according to this embodiment in a vacuum.

Prior to the vapor deposition step, the vapor deposition mask used at the vapor deposition step for forming the vapor-deposition layer vapor-deposited for each pixel such as the light-emitting layer and the hole transport layer is prepared in advance at prepare step S20 for the vapor deposition mask. Note that details of prepare step S20 for the vapor deposition mask will be described later. In addition, the layers formed by using this vapor deposition mask are not limited to the light-emitting layer and the hole transport layer, and may be any layer formed for each pixel (namely, in the opening of the pixel bank).

Then, a transparent electrode facing a reflective electrode via the organic EL layer is formed to cover the organic EL layer.

Then, next, the sealing layer 5 is formed at sealing step S13. As an example, the sealing layer 5 can include a three layer structure in which the inorganic layer 6, the organic layer 7, and the inorganic layer 8 are layered in this order from the TFT substrate 2 side. Since the frame-shaped bank 4 is formed, the organic film 7 can be formed to have a large thickness of, for example, 1.0 μm or greater.

After this sealing layer 5 is formed, flexible step S14 is performed. At flexible step S14, glass of the substrate is peeled off, and a film or the like serving as a support body is affixed.

Then, next, at singulation step S15, each organic EL display panel formation region 9 is cut out. Accordingly, each organic EL display panel formation region 9 is formed as an individual piece. Accordingly, a display panel (organic EL display panel) having flexibility and an irregular shape is formed.

Then, at mounting step S16, a member such as a driver is mounted on each organic EL display panel formation region 9 formed as an individual piece. Accordingly, the organic EL display device is complete.

In this embodiment, the active region 3 has, for example, an irregular shape different from a rectangular or square shape, and hence, an external shape of the display panel also has an irregular shape corresponding to the shape of the active region 3.

Figure 4:
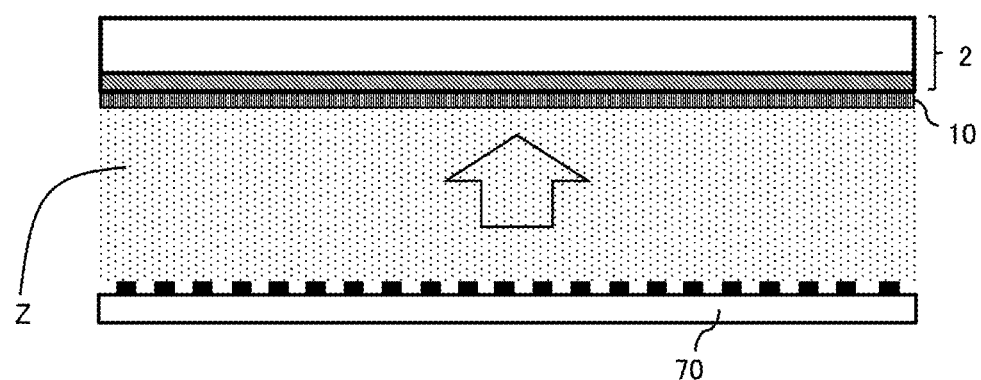
FIG. 4 is a schematic view illustrating a state at a vapor deposition step at the time of forming a vapor-deposition layer of an organic EL display device according to the first embodiment.

FIG. 4 is a schematic view illustrating a state at the vapor deposition step for forming the light-emitting layer or the like (vapor-deposition layer vapor-deposited on each pixel such as the light-emitting layer and the hole transport layer) of the organic EL display device according to the first embodiment of the disclosure.

At the vapor deposition step at which the light-emitting layer or the like is vapor-deposited, a vapor deposition mask 10 provided with a mask sheet 15 having a plurality of through-holes is brought into close contact with the TFT substrate 2, and in a vacuum, vapor deposition particles Z (for example, an organic light-emitting material) caused to evaporate with a vapor deposition source 70 are vapor-deposited on the pixels of the TFT substrate 2 through the mask sheet 15. Accordingly, a vapor deposition pattern having a pattern corresponding to the through-hole of the mask sheet 15 is formed on the TFT substrate 2.

Figure 5:
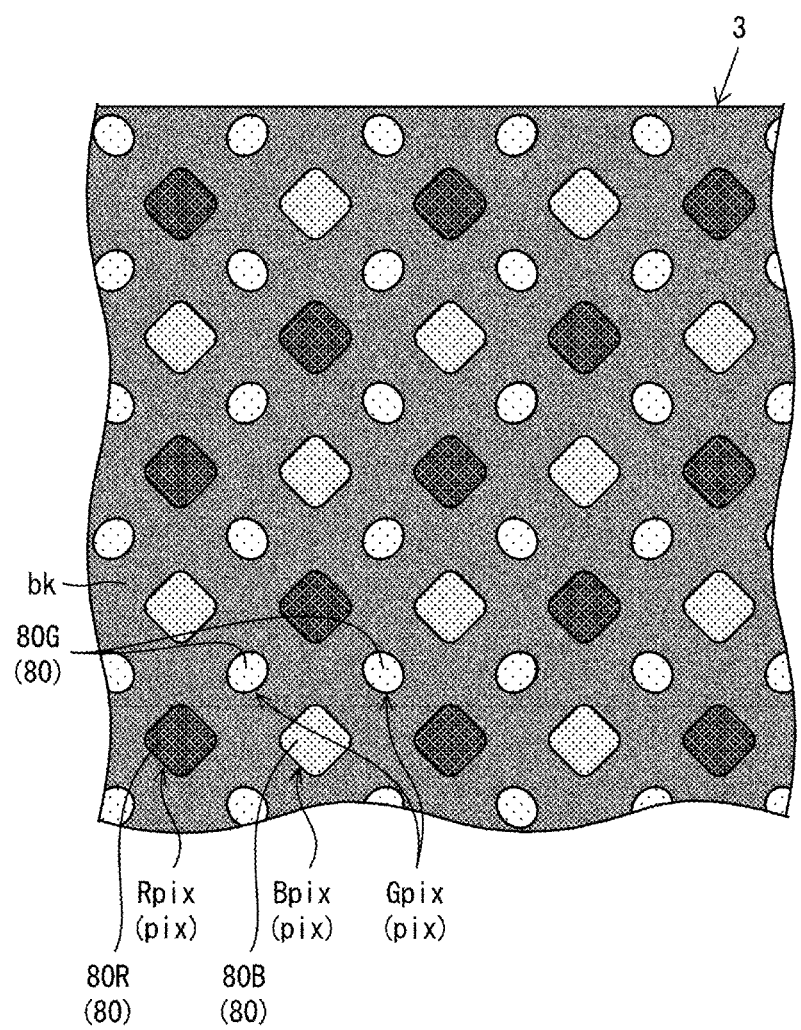
FIG. 5 is an enlarged view of a portion of an active region 3 according to the first embodiment.

FIG. 5 is an enlarged view of a portion of the active region 3 according to the first embodiment. On the active region 3, pixels pix contributing to displaying of an image are disposed to be arranged in a matrix shape. On each of the pixels pix, a light-emitting layer 80 is formed. A peripheral region surrounding the pixels pix serves as a pixel bank bk.

Figure 6:
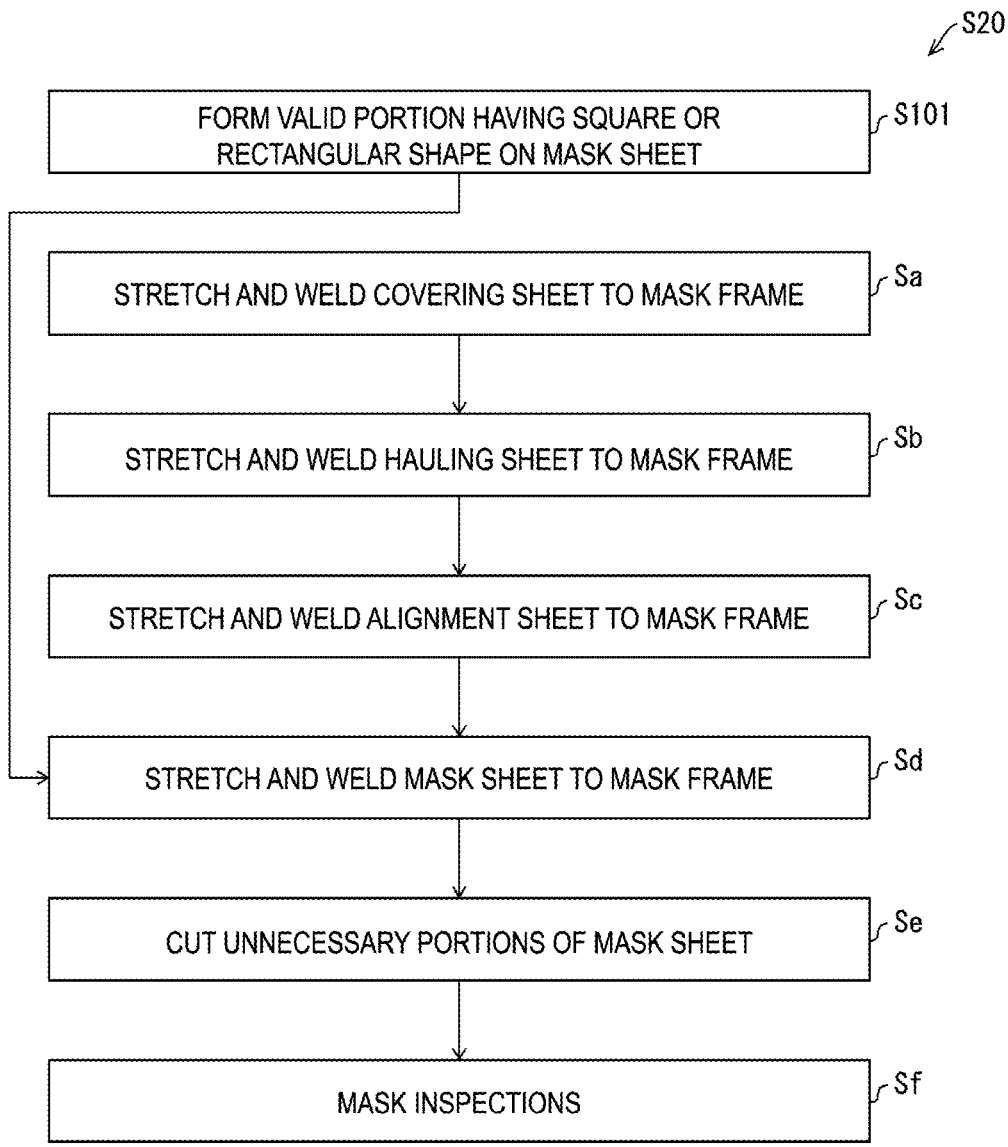
FIG. 6 is a view illustrating a vapor deposition step for a vapor-deposition layer of the organic EL display panel according to the first embodiment.

As an example, in FIG. 6, a red pixel Rpix on which a red light-emitting layer 80R configured to emit red light is formed, a green pixel Gpix including a green light-emitting layer 80G configured to emit green light, and a blue pixel Bpix including a blue light-emitting layer 80B configured to emit blue light are arranged in a pentile matrix. However, the pixel arrangement is not particularly limited to the pentile matrix, and may be other arrangement such as stripe arrangement.

Note that a shape of the light-emitting layer 80 is a shape of the opening of the pixel bank bk in which the light-emitting layer 80 is formed.

Vapor Deposition Mask

Figure 7A:
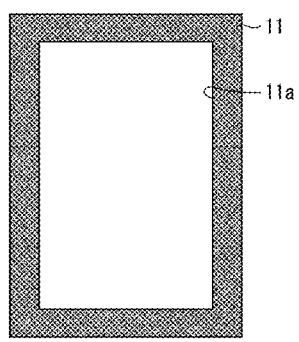
FIGS. 7A to 7F are views each illustrating a state where a vapor deposition mask according to the first embodiment is prepared.
Figure 7B:
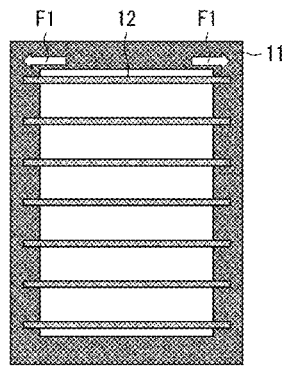
Figure 7C:
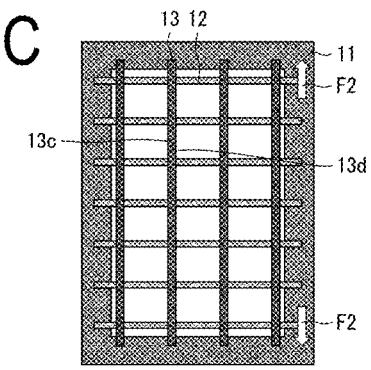
Figure 7D:
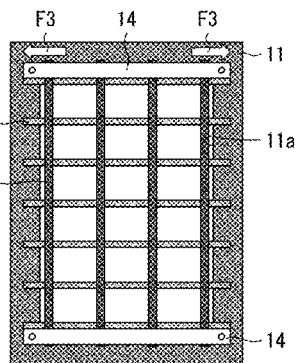
Figure 7E:
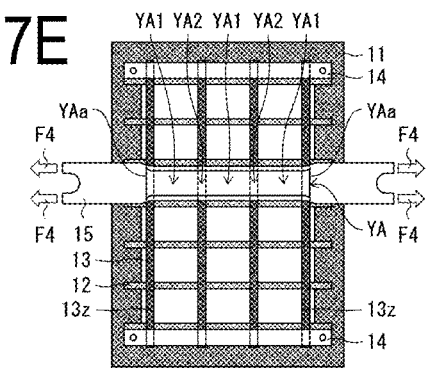
Figure 7F:
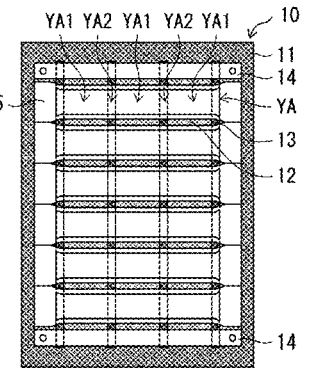

Next, prepare step S20 for the vapor deposition mask used at the vapor deposition step will be described. FIG. 6 is a view illustrating the vapor deposition step for the light-emitting layer of the organic EL display panel according to the first embodiment. FIGS. 7A to 7F are views each illustrating a state where the vapor deposition mask according to the first embodiment is prepared. FIG. 7A is a plan view illustrating a mask frame. FIG. 7B is a view illustrating a state where a covering sheet is attached to the mask frame. FIG. 7C is a view illustrating a state where a hauling sheet is attached to the mask frame. FIG. 7D is a view illustrating a state where an alignment sheet is attached to the mask frame. FIG. 7E is a view illustrating a state where a mask sheet is attached to the mask frame. FIG. 7F is a plan view of the vapor deposition mask prepared.

As illustrated at step Sa in FIG. 6 and illustrated in FIGS. 7A and 7B, a plurality of covering sheets 12 are attached to a mask frame 11 having a frame shape and including a frame opening 11a in a region surrounded by the frame (covering-sheet attachment step).

For example, an invar material or the like having a significantly low thermal expansion and a thickness ranging from 20 mm to 30 mm is used as a base material of the mask frame 11. The mask frame 11 is sufficiently thick as compared to the mask sheet, and has high rigidity to enable sufficient accuracy to be secured even at the time of stretching and welding of the mask sheet.

The covering sheets 12 each serve to fill a gap between mask sheets to be subsequently attached to the mask frame 11, and serve to close a dummy pattern formed on the mask sheet.

For example, an invar material or the like having a thickness ranging from 30 μm to 50 μm is used as a base material of the covering sheets 12. The covering sheets 12 each have an elongated shape, and extends in a straight manner from one end portion to the other end portion.

At the time of attachment of the covering sheets 12 to the mask frame 11, both end portions of the covering sheets 12 are welded to insides of grooves provided in the mask frame 11 while both the end portions of the covering sheets 12 are stretched (pulled) by application of force to each of both the end portions of the covering sheets 12 in an outward direction (in a direction away from each other) as indicated by arrow F1 in FIG. 7B. Then, unnecessary portions located outside of the welded portions of the covering sheets 12 are cut off. Accordingly, each of the covering sheets 12 is attached at a predetermined position of the mask frame 11. In this embodiment, the covering sheets 12 are attached to the mask frame 11 to be parallel to each other in a shorter side direction of the mask frame 11. The covering sheets 12 are attached to the mask frame 11 to be arranged on a longer side of the mask frame 11 and to be parallel to each other.

Next, as illustrated at step Sb in FIG. 6 and illustrated in FIG. 7C, hauling sheets 13 (also referred to as support sheets) are attached to the mask frame 11 to which the covering sheets 12 are attached (hauling-sheet attachment step).

The hauling sheets 13 serve to support a mask sheet that is subsequently to be attached to the mask frame 11 without being loosened, and serve to close a dummy pattern formed on the mask sheet.

In addition, in this embodiment, as will be described later, the hauling sheets 13 also serve to cover vapor deposition holes located outside of a region corresponding to the active region, which are a portion of the plurality of vapor deposition holes present in a valid portion YA provided on the mask sheet 15.

For example, an invar material or the like having a thickness ranging from 30 μm to 100 μm is used as a base material of the hauling sheets 13. A width of each of the hauling sheets 13 ranges, for example, from approximately 8 mm to 10 mm, and is determined according to layout on a substrate on which a panel is disposed. The howling sheets 13 each have an elongated shape, and each extend in a straight manner from one end portion to the other end portion.

Typically, in a display panel having a portrait shape, since a terminal portion is masked with a hauling sheet, a width of the hauling sheet is larger than a width of the covering sheet, but the hauling sheet is disposed at a position where the hauling sheet does not overlap with a display region (namely, a valid portion of a mask sheet) of the display panel.

At the time of attachment of the hauling sheets 13 to the mask frame 11, both end portions of the hauling sheets 13 are welded to insides of grooves provided in the mask frame 11 while both the end portions of the hauling sheets 13 are stretched (pulled) by application of force in an outward direction (in a direction away from each other) as indicated by arrow F2 in FIG. 7C. Then, unnecessary portions located outside of the welded portions of the hauling sheets 13 are cut off. Accordingly, each of the hauling sheets 13 is attached at a predetermined position of the mask frame 11.

In this embodiment, the hauling sheets 13 are attached to the mask frame 11 to be parallel to each other on the longer side of the mask frame 11. The hauling sheets 13 are attached to the mask frame 11 to be arranged in the shorter side direction of the mask frame 11 and to be parallel to each other.

Note that the order of attachment of the covering sheets 12 and the hauling sheets 13 to the mask frame 11 may be reversed (reverse the order of step Sa and step Sb in FIG. 6), and the hauling sheets 13 may first be attached to the mask frame 11, and then, the covering sheets 12 may be attached to the mask frame 11.

The plurality of covering sheets 12 and a plurality of the hauling sheets 13 are attached to the mask frame 11 in a lattice pattern as illustrated in FIG. 7C, and accordingly, openings each defined by the covering sheets 12 facing each other and the hauling sheets 13 facing each other are formed to be arranged.

Next, as illustrated at step Sc in FIG. 6 and illustrated in FIG. 7D, alignment sheets 14 including alignment marks formed are attached to the mask frame 11 to make the alignment marks located at predetermined positions (alignment-sheet attachment step).

At the time of attachment of the alignment sheets 14 to the mask frame 11, both end portions of the alignment sheets 14 are welded to predetermined positions of the mask frame 11 while both the end portions of the alignment sheets 14 are stretched (pulled) by application of force to each of both the end portions of the alignment sheets 14 in an outward direction (in a direction away from each other) and in a direction parallel to the short-hand direction of the mask frame 11 as indicated by arrow F3 in FIG. 7D. Then, unnecessary portions located outside of the welded portions of the alignment sheets 14 are cut off. Accordingly, each of the alignment sheets 14 is attached at a predetermined position of the mask frame 11. In this embodiment, two alignment sheets 14 are attached to the mask frame 11 to be parallel to each other along a shorter side of the frame opening 11a of the mask frame 11.

Next, as illustrated at step Sd in FIG. 6 and illustrated in FIG. 7E, a plurality of the mask sheets 15 are attached to the mask frame 11 (mask-sheet attachment step). The mask sheets 15 are sheets used, for example, for separately patterning RGB to pattern and form the vapor-deposition layer in the pixels in the active region 3 illustrated in FIGS. 2 and 3. At step Sd, a first region YA1 and a second region YA2 are provided in the valid portion YA of the mask sheet 15.

In addition, prior to step Sd and before the mask sheets 15 are attached to the mask frame 11, a plurality of vapor deposition holes are formed to be arranged, and thereby, the valid portion YA on the mask sheet 15 is formed at step S101 (valid-portion forming step). The valid portion YA extends across the active regions 3, namely, has area to the extent that the valid portion YA substantially overlaps with the plurality of active regions 3. Details of the valid portion YA, the first region YA1, and the second region YA2 will be described in detail later.

At step Sd, at the time of attachment of the mask sheet 15 to the mask frame 11, both end portions of the mask sheet 15 are accurately welded at predetermined positions of the mask frame 11 to make the vapor deposition holes constituting the valid portion YA located at a predetermined position by using the alignment mark formed on the alignment sheet 14 as a reference while both the end portions of the mask sheet 15 are stretched (pulled) by application of force to each of both the end portions of the mask sheet 15 in an outward direction (in a direction away from each other) as indicated by arrow F4 in FIG. 7E.

In addition, at the time of stretching and welding of the mask sheet 15, the stretching and welding are performed while counter force is applied on the mask frame 11 according to an amount of deformation of the mask sheet 15 obtained after the stretching and welding. Accordingly, the mask sheet 15 is attached to the mask frame 11 to make an extending direction of the valid portion YA intersect at a right angle an extending direction of each hauling sheet 13.

Then, after all the necessary sheets of the mask sheets 15 are attached to the mask frame 11 to cause all the openings defined by the covering sheets 12 and the hauling sheets 13 to be covered with the valid portions YA as illustrated in FIG. 7F, unnecessary portions located outside of the welded portions of the mask sheets 15 are cut off as illustrated at step Se in FIG. 6 and illustrated in FIG. 7F.

Accordingly, the vapor deposition mask 10 is complete.

Next, as illustrated at step Sg in FIG. 6, the vapor deposition mask 10 complete is cleaned, and various mask inspections such as an inspection for foreign matters and an inspection for accuracy are performed. Subsequently, vapor deposition masks 10 having no problem found in the mask inspections are stored in a stocker, and are supplied to a vapor deposition apparatus used at the vapor deposition step as needed.

Valid Portion YA

FIGS. 8A to 8D are views each illustrating a configuration of the mask sheet 15 according to the first embodiment. FIG. 8A is a plan view of the mask sheet 15. FIG. 8B is an enlarged view of the valid portion illustrated in FIG. 8A. FIG. 8C is a cross-sectional view taken along line B-B illustrated in FIG. 8B. FIG. 8D is a cross-sectional view taken along line C-C illustrated in FIG. 8B.

As illustrated in FIG. 8A, the mask sheet 15 has a strip shape, and for example, an invar material or the like having a thickness ranging from 10 µm to 50 µm, preferably, a thickness of approximately 25 µm is used as a base material of the mask sheet 15. To prevent the vapor-deposition layer vapor-deposited from having a nonuniform thickness, the mask sheet 15 includes a sheet having a small thickness.

The valid portion YA extending in a longitudinal direction of the mask sheets 15 is formed between both the end portions of the mask sheet 15. In the valid portion YA, a plurality of vapor deposition holes H corresponding to the pixels are formed to be arranged. The valid portion YA extends across the plurality of active regions 3 of the TFT substrate 2, and has area to the extent that the valid portion YA substantially overlaps with the plurality of active regions 3.

The valid portion YA overlaps with a plurality of hauling sheets 13 (FIGS. 7E and 7F). In this embodiment, of the plurality of hauling sheets 13, hauling sheets 13z located at both ends overlap with portions at or near both end portions YAa of the valid portion YA. A region YAb between regions overlapping with the hauling sheets 13z located at both ends of the valid portion YA is a region including a region overlapping with each active region 3. In this embodiment, the region YAb of the valid portion YA has a constant width (a length in a direction perpendicular to the extending direction) even in a state where the mask sheet 15 is stretched. Then, of the mask sheet 15, a region where the region YAb of the valid portion YA is provided also has a constant width even in a state where the mask sheet 15 is stretched.

Hence, in a portion at or near the region YAb of the valid portion YA of the mask sheet 15, stress applied when the mask sheet 15 is stretched becomes uniform. Accordingly, the mask sheet 15 can be stretched and attached to the mask frame 11 with high accuracy at the mask-sheet attachment step.

In addition, of the mask sheet 15, the regions located outside of the region YAb of the valid portion YA, namely, the regions overlapping with the hauling sheets 13z at both the ends each have a width gradually increasing outward.

As illustrated in FIGS. 7E and 7F and FIG. 8B, the valid portion YA includes the first region YA1 and the second region YA2. The first region YA1 is formed for each active region 3 (see FIG. 2), and has a shape corresponding to a shape of the active region 3. The second region YA2 is a region of the valid portion YA different from the first region YA1, and is a region overlapping with the hauling sheet 13. The region YAb of the valid portion YA illustrated in FIG. 8A and having a constant width is a region including the first region YA1 and the second region YA2 located between first regions YA1.

As illustrated in FIG. 8B, in the valid portion YA, the vapor deposition holes H present in the first region YA penetrate, and the vapor deposition holes H present in the second region YA2 are covered with the hauling sheet 13.

The vapor deposition holes H present in the first region YA are vapor deposition holes for patterning and forming of the vapor-deposition layer for each pixel. The vapor deposition holes H present in the second region YA2 are dummy vapor deposition holes not contributing to patterning and forming of the vapor-deposition layer for each pixel.

At the vapor deposition step, the first region YA1 of the valid portion YA of the mask sheet 15 overlaps with the active region 3 (see FIGS. 2 and 3) of the TFT substrate 2, and the second region YA2 located outside of the first region YA1 and an edge portion surrounding the valid portion YA overlap with the frame region 44 (see FIGS. 2 and 3). Then, vapor deposition particles coming from the vapor deposition source pass through the vapor deposition holes H present in the first region YA1, and are vapor-deposited on the pixels of the active region 3 of the TFT substrate 2. At this time, the second region YA2 and the edge portion surrounding the valid portion YA of the mask sheet 15 overlap with the frame region 44 of the TFT substrate 2, and hence, vapor deposition particles are blocked by the second region YA2 and the edge portion surrounding the valid portion YA, and do not arrive at the frame region 44.

In the case where the light-emitting layer is vapor-deposited on the TFT substrate through the mask sheet 15, the vapor deposition holes H are formed in the valid portion YA to correspond to a formation region for a light-emitting layer configured to emit light of any of colors that the light-emitting layers emit. For example, in the case where the light-emitting layer configured to emit red light, the light-emitting layer configured to emit green light, and the light-emitting layer configured to emit blue light are formed in the active region 3, the vapor deposition holes H are formed in the same pattern as a pattern of any of the light-emitting layer configured to emit red light, the light-emitting layer configured to emit green light, and the light-emitting layer configured to emit blue light.

The vapor deposition holes H of the second region YA2 are the same as the vapor deposition holes H of the first region YA1 in a pitch and a shape.

Of the valid portion YA, the regions overlapping with the active region 3 and the regions located between the regions overlapping with this active region 3 include a combination of the first region YA1 and the second region YA2 to have a rectangular or square shape different from an irregular shape.

Note that the irregular shape is a shape in which at least a portion of an edge (a side or a corner) in the case where an external shape of an organic EL display panel is a rectangular or square shape includes an irregular-shape portion protruding inwardly (a central portion direction of the rectangular or square shape) or outwardly (in a direction away from the central portion of the rectangular or square shape) from the edge. The irregular-shape portion refers to a portion having a shape different from a rectangular or square shape, such as a shape in which corners are curved, rather than right-angled, that is, the corners each have a so-called rounded shape (round shape), and a shape in which at least one side of four sides has a notched portion recessed to protrude from an edge in the central portion direction.

At step S101 illustrated in FIG. 6, the vapor deposition holes H are prepared in the mask sheet 15, for example, in the following manner.

First, a negative-working or positive-working photosensitive resist is applied to both surfaces of an elongated plate made of an invar material to form resist films on both main surfaces (a first surface and a second surface).

Then, the resist films of the first surface and the second surface are subjected to exposure and developing using an exposure mask to form resist patterns on both surfaces of the elongated plate. Then, the resist pattern on the first surface is used as a mask to perform etching of a first surface 15b (surface facing the TFT substrate 2 at the time of vapor deposition) of the valid portion YA (etching of an upper face of the edge portion is not performed), and openings K are formed on the first surface 15b of the valid portion YA (at this stage, the openings K are still not vapor deposition holes penetrating).

Then, the first surface 15b is covered with a resistant resin having an etching resistant property, and the resist pattern on a second surface 15c (surface opposite to the surface facing the TFT substrate 2 at the time of vapor deposition) is used as a mask to perform etching of the valid portion YA and a lower face of the edge portion. Accordingly, the vapor deposition holes H (through-holes) are formed in the valid portion YA by erosion from the second surface 15c side to form a plurality of recesses on the lower face of the edge portion.

The plurality of vapor deposition holes H of the valid portion YA are formed in a matrix shape or an oblique lattice pattern in the longitudinal direction and the short-hand direction (width direction) of the mask sheet 15. The openings K of the plurality of vapor deposition holes H (openings on the upper face) are shaped into a quadrangle shape including corners each having a round shape, or a circular shape or an elliptic shape to correspond to a shape of an opening of a pixel bank layer of the substrate. In the valid portion YA, etching of each of the vapor deposition holes H on the second surface 15c side is performed in a more extensive and deeper manner than on the first surface 15b side, and thereby, a shading portion (a height of a partition between two adjacent vapor deposition holes) is made small, and vapor deposition accuracy and vapor deposition efficiency relative to the substrate can be enhanced.

The valid portion YA has a configuration in which when a cross section is taken along line B-B passing through the center of two openings K adjacent in the lateral direction, the base material becomes minimum (a cavity is maximum) as illustrated in FIG. 8C; and when a cross section is taken along line C-C parallel to line B-B and passing through a point located equidistant from two openings K adjacent in the vertical direction, the base material becomes maximum (a cavity is minimum) (a maximum thickness is equal to a thickness Ti of the base material) as illustrated in FIGS. 8C and 8D. Accordingly, the mask sheet 15 is prepared.

Figure 9:
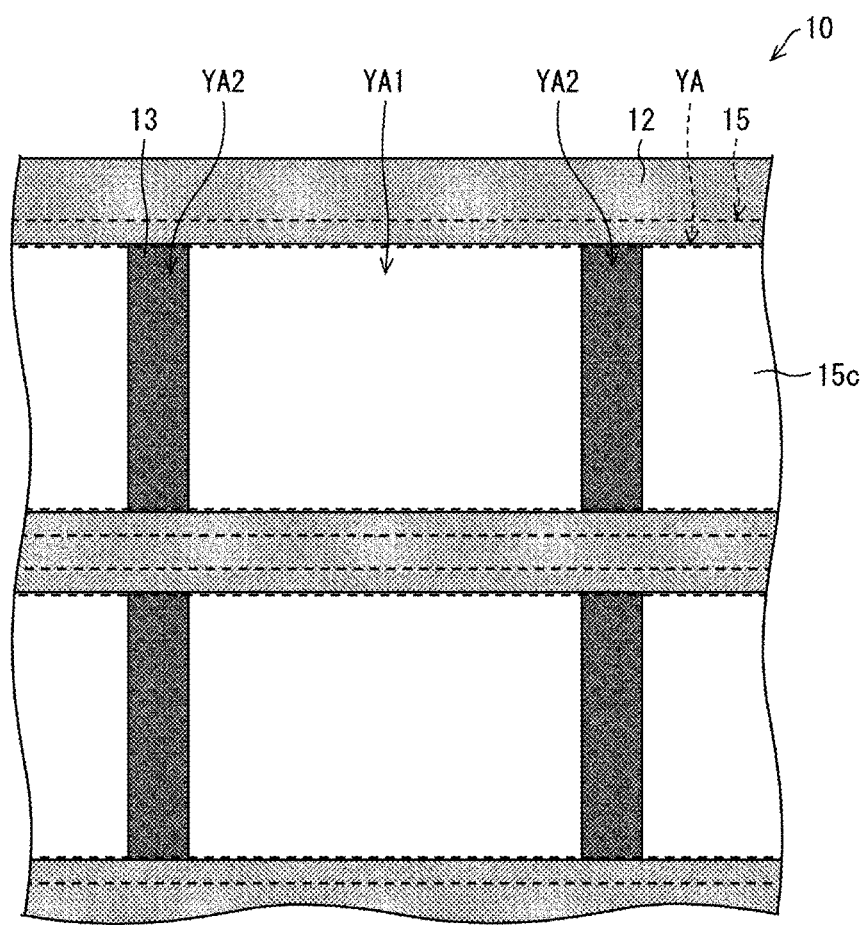
FIG. 9 is a view illustrating a state of a portion of the vapor deposition mask according to the first embodiment as viewed from a second surface side.
Figure 10:
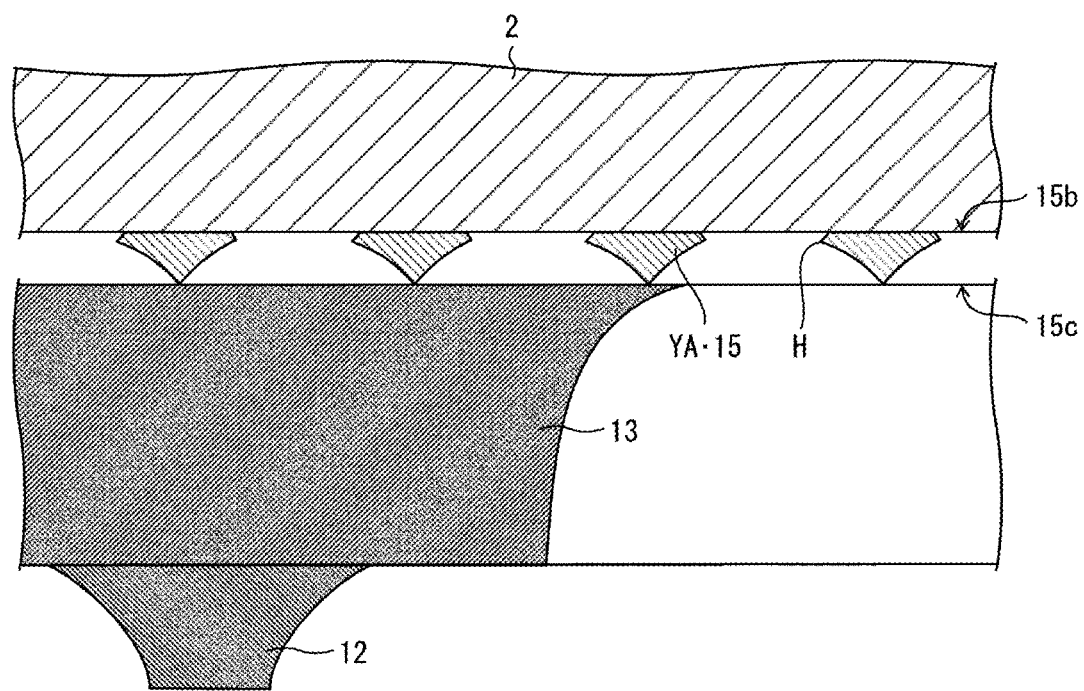
FIG. 10 is a cross-sectional view of a vapor deposition mask and a TFT substrate at the time of performing vapor deposition at a vapor deposition step according to the first embodiment.

FIG. 9 is a view illustrating a state of a portion of the vapor deposition mask 10 as viewed from the second surface 15c side. FIG. 10 is a cross-sectional view of the vapor deposition mask 10 and the TFT substrate 2 at the time of performing vapor deposition at the vapor deposition step.

As illustrated in FIGS. 9 and 10, the valid portion YA in which the plurality of vapor deposition holes are formed to be arranged is provided to extend across the plurality of active regions 3. Then, the valid portion YA includes the first region YA1 and the second region YA2.

The first region YA1 has a shape corresponding to a shape of the active region 3, and is provided for each active region 3. Then, the second region YA2 defines a shape of the first region YA1, and overlaps with the hauling sheet 13 to cause the vapor deposition holes H to be covered.

Hence, at the time of stretching the mask sheet 15 to attach the mask sheet 15 to the mask frame 11 (FIG. 7E), stress is uniformly applied on the first region YA1 and on a region located in a portion at or near the second region YA2 sandwiched between the first regions YA1 of the mask sheet 15. Accordingly, the mask sheet 15 can be attached to the mask frame 11 with enhanced relative positional accuracy of each vapor deposition hole and the mask frame 11. As a result, the vapor deposition mask 10 that can be used for patterning and forming a vapor-deposition layer with high accuracy can be obtained.

In addition, a position and a shape of the second region YA2 defining an external shape of the first region YA1 can be defined by a position and a shape of the hauling sheet 13. Hence, since it is not necessary to change the external shape of the valid portion YA even when the external shape of the active region 3 changes, commonality of the mask sheet 15 including the valid portion YA formed can be achieved between substrates having various external shapes.

For example, the commonality of the mask sheet 15 used to form the active regions 3 having different aspect ratios such as 4:3, 16:9, and 18:9 can be achieved.

In addition, as illustrated in FIG. 10, each hauling sheet 13 is in contact with the second surface 15c of the mask sheet 15 located on the opposite side to the first surface 15b facing the TFT substrate 2. Accordingly, occurrence of a shadow due to a distance between the TFT substrate 2 and each hauling sheet 13 can be prevented at the time of vapor deposition for the TFT substrate 2.

Figure 11:
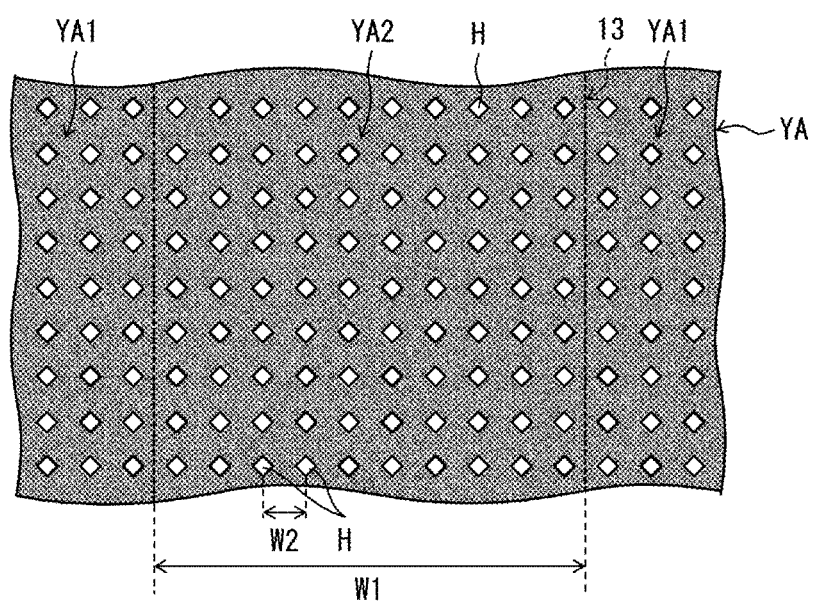
FIG. 11 is an enlarged view of a portion at or near a second region of a valid portion according to the first embodiment.

FIG. 11 is an enlarged view of a portion at or near the second region YA2 of the valid portion YA according to the first embodiment. In this embodiment, a pitch W2 at which the vapor deposition holes H present in the second region YA2 are arranged is preferably equal to a pitch at which the vapor deposition holes H present in the first region YA1 are arranged as illustrated in FIG. 11. Accordingly, formation of the valid portion YA is facilitated.

In addition, in the valid portion YA, a width W1 between the first regions YA1 is set to an integral multiple of the pitch W2 of the vapor deposition holes H. Accordingly, formation of the valid portion YA is facilitated.

In this embodiment, further, shapes of the vapor deposition holes H present in the first region are the same as shapes of the vapor deposition holes H present in the second region YA2.

Second Embodiment

Figure 12:
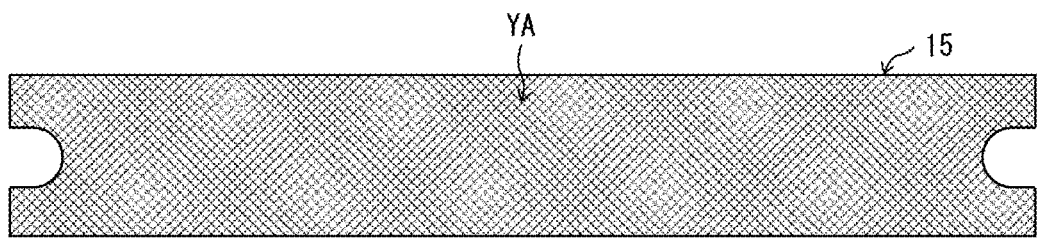
FIG. 12 is a view illustrating a configuration of a mask sheet according to a second embodiment.
Figure 13:
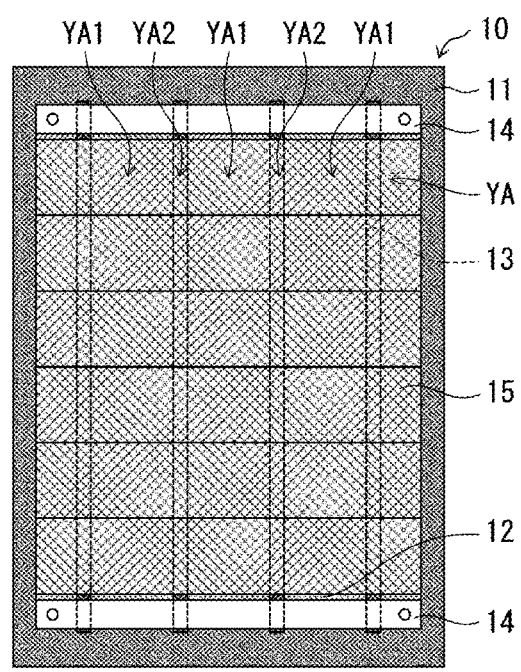
FIG. 13 is a view illustrating a configuration of a vapor deposition mask according to the second embodiment.

FIG. 12 is a view illustrating a configuration of a mask sheet 15 according to a second embodiment. As illustrated in FIG. 12, vapor deposition holes, namely, valid portions YA are formed on all the mask sheet 15. FIG. 13 is a view illustrating a configuration of a vapor deposition mask 10 according to the second embodiment. In the vapor deposition mask 10 illustrated in FIG. 13, a plurality of mask sheets 15 illustrated in FIG. 12 are attached to the mask frame 11.

In the vapor deposition mask 10 illustrated in FIG. 13, the valid portions YA of each mask sheet 15 each are provided to extend across a plurality of active regions 3. Then, each of the valid portions YA has a first region YA1 having a shape corresponding to a shape of each of the active regions 3 (FIGS. 2 and 3), and a second region YA2 overlapping with a hauling sheet 13.

In the mask sheet 15 illustrated in FIGS. 12 and 13, at the time of stretching the mask sheet 15 to attach the mask sheet 15 to the mask frame 11 (FIG. 7E), stress is uniformly applied on the first region YA1 and on a region located in a portion at or near the second region YA2 sandwiched between first regions YA1 of the mask sheet 15.

In particular, in the mask sheet 15 illustrated in FIGS. 12 and 13, since the valid portion YA is provided on all the mask sheet 15, stress occurring at the time of stretching the mask sheet 15 is more uniformly applied on all the mask sheet 15. Accordingly, the mask sheet 15 can be attached to the mask frame 11 with enhanced relative positional accuracy of each vapor deposition hole and the mask frame 11. As a result, the vapor deposition mask 10 that can be used for patterning and forming a vapor-deposition layer with high accuracy can be obtained.

In addition, a position and a shape of the second region YA2 defining an external shape of the first region YA1 can be defined by a position and a shape of the hauling sheet 13. Hence, since it is not necessary to change an external shape of the valid portion YA even when an external shape of the active region 3 changes, commonality of the mask sheet 15 including the valid portion YA formed can be achieved between substrates having various external shapes.

Third Embodiment

Figure 14:
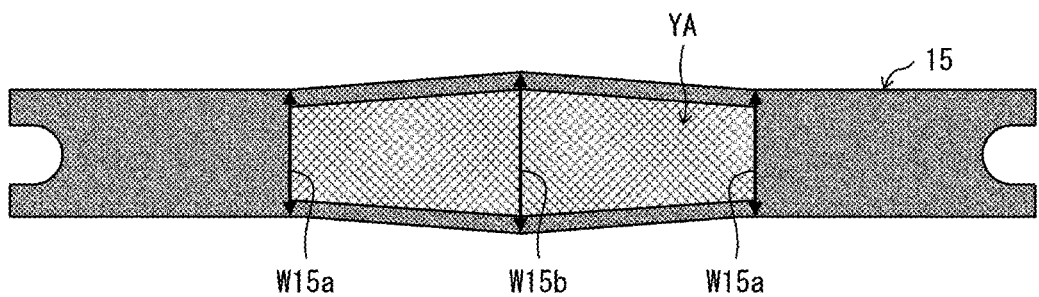
FIG. 14 is a view illustrating a configuration of a mask sheet according to a third embodiment.
Figure 15:
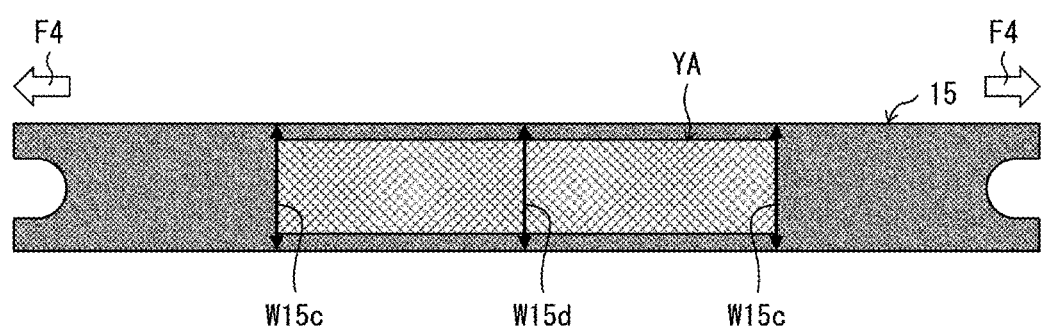
FIG. 15 is a view illustrating a state where the mask sheet illustrated in FIG. 14 is stretched to be attached to a mask frame.

FIG. 14 is a view illustrating a configuration of a mask sheet 15 according to a third embodiment. FIG. 15 is a view illustrating a state where the mask sheet 15 illustrated in FIG. 14 is stretched to be attached to the mask frame 11.

Here, in a valid portion of the mask sheet, rigidity at a central portion is relatively smaller than rigidity at both end portions.

Thereby, in the mask sheet 15 illustrated in FIG. 14, a valid portion YA has a width gradually increasing from both the end portions toward the central portion. Then, a width of the mask sheet 15 gradually increases from a width W15a at each of positions including both the end portions of the valid portion YA, toward a width W15$b$ at a position including the central portion of the valid portion YA.

Hence, at the time of stretching both ends of the mask sheet 15 outward as indicated by arrow F4 as illustrated in FIG. 15, the extent of decrease in the width at the central portion of the valid portion YA is greater than the extent of decrease in the width at each of both end portions of the valid portion YA. As both the ends of the mask sheet 15 are stretched, a width W15$c$ of the mask sheet 15 at each of positions including both the end portions of the valid portion YA is the same as a width W15$d$ at a position including the central portion of the valid portion YA.

Accordingly, positional accuracy of vapor deposition holes relative to the mask frame can be improved.

Fourth Embodiment

Figure 16:
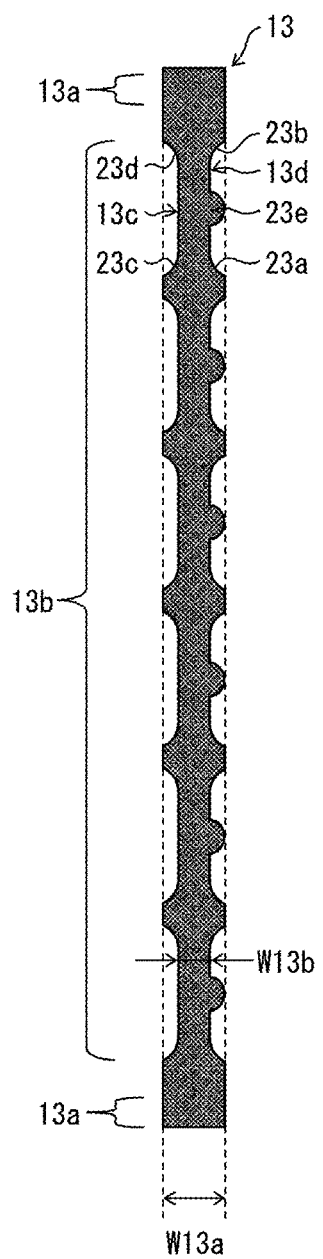
FIG. 16 is a view illustrating a configuration of a hauling sheet according to the third embodiment.
Figure 17:
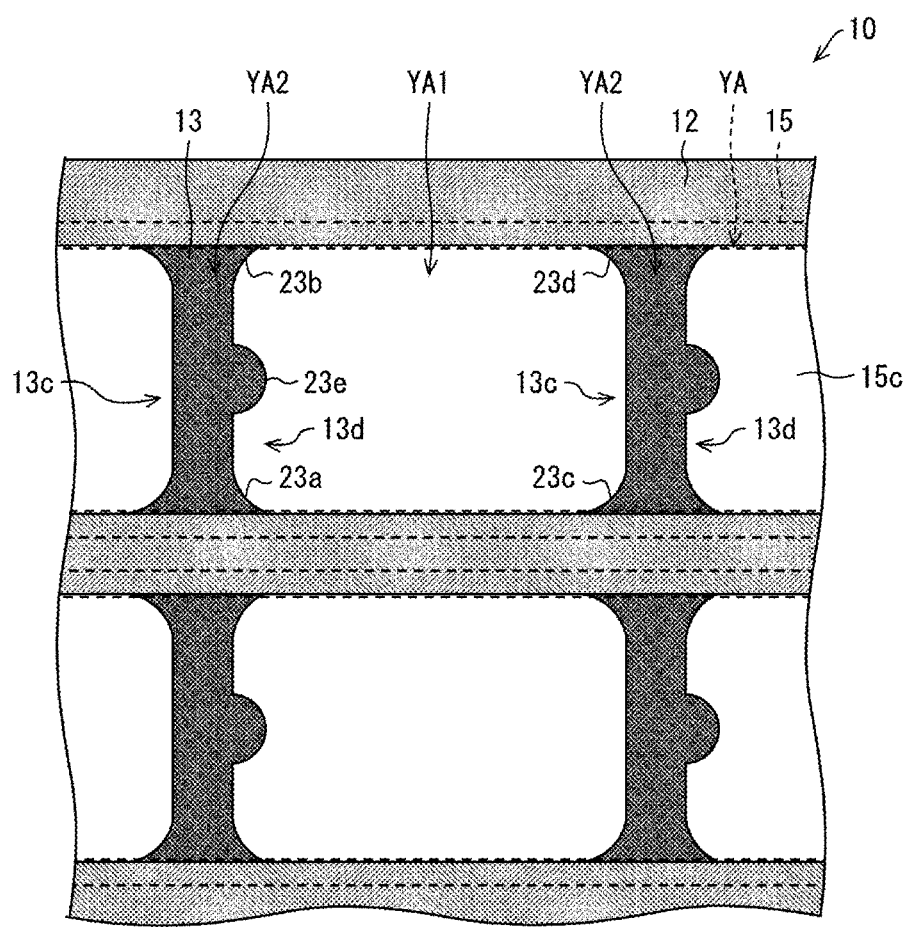
FIG. 17 is a view illustrating a state of a portion of a vapor deposition mask according to a fourth embodiment as viewed from a second surface side.
Figure 18:
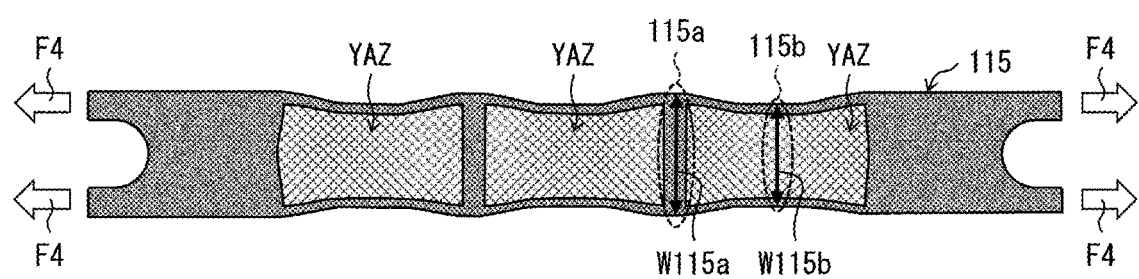
FIG. 18 is a view illustrating a state where a mask sheet of the related art is curved at the time of stretching the mask sheet of the related art.

FIG. 16 is a view illustrating a configuration of a hauling sheet 13 according to a third embodiment. FIG. 17 is a view illustrating a state of a portion of a vapor deposition mask according to the fourth embodiment as viewed from a second surface 15$c$ side.

In the case where vapor deposition is performed on an active region having an irregular shape, a hauling sheet 13 is provided with a shape corresponding to a shape of an irregular-shape portion as illustrated in FIG. 16.

As illustrated in FIG. 16, the hauling sheet 13 according to this embodiment is provided with a convex and a recess or the like including a shape of the irregular-shape portion of the external shape of the active region, and extending from one end portion to the other end portion. The hauling sheet 13 includes attachment regions 13$a$ being regions located in portions at or near both end portions of the hauling sheet and overlapping with the mask frame 11 when the hauling sheet 13 is attached to the mask frame 11 (FIG. 7C), and includes an external-shape forming region 13$b$ of an active region being a region located between the attachment regions 13$a$ and forming the external shape of the active region.

The external-shape forming region 13$b$ of the active region has an uneven shape for forming the external shape of at least a portion of the active region including the irregular-shape portion of the active region.

Of the external-shape forming region 13$b$ of the active region, notched portions 13$c$ are formed to be arranged on one side extending in an extending direction, and notched portions 13$d$ are formed to be arranged on the other side extending in the extending direction.

The notched portions 13$c$ and 13$d$ each have a shape corresponding to a shape of the irregular-shape portion, for example, having an arc shape of the active region, such as a notched portion 43$d$ and four corners 43$a$ to 43$d$.

The notched portions 13$c$ each include curved portions 23$c$ and 23$d$ for forming adjacent two corners each having a round shape and being the irregular-shape portion of the active region. The notched portions 13$d$ each include curved portions 23$a$ and 23$b$ for forming adjacent two corners each having a round shape and being the irregular-shape portion of the active region, and also each include a protruding portion 23$e$ having a protruding shape of the same shape as a shape of a notch of the active region, and being provided between the curved portions 23$a$ and 23$b$.

A plurality of the hauling sheets 13 illustrated in FIG. 16 are attached to the mask frame 11 in parallel (FIG. 7C), and a mask sheet 15 is attached to the mask frame 11 (FIGS. 7E and 7F).

Then, according to the hauling sheet 13 illustrated in FIG. 16, an external shape of a first region YA1 is defined by the curved portion 23$a$, the protruding portion 23$e$, the curved portion 23$b$, the curved portion 23$c$, and the curved portion 23$d$ each serving as the irregular-shape portion.

The protruding portion 23$e$ is a notch provided on one side of the first region YA1 and protruding from this one side toward an interior direction of this first region YA1. The curved portions 23$a$ to 23$d$ define a shape in which four corners of the first region YA1 each have a round shape. Vapor deposition holes in the first region YA1 surrounded by the curved portion 23$a$, the protruding portion 23$e$, the curved portion 23$b$, the curved portion 23$c$, and the curved portion 23$d$ are not covered with the hauling sheet 13, and are through-holes. On the other hand, vapor deposition holes located outside the first region YA1 in the curved portion 23$a$, the protruding portion 23$e$, the curved portion 23$b$, the curved portion 23$c$, and the curved portion 23$d$ are covered with the hauling sheet 13.

As such, according to the first region YA1 having an irregular-shape portion, a vapor-deposition layer is formed on each pixel of the active region having the same external shape as the shape of the first region YA1, namely, having the irregular-shape portion.

According to the vapor deposition mask 10 according to this embodiment, a valid portion does not need to correspond to the shape of the active region having the irregular-shape portion, and hence, the valid portion can have a shape in which at least an external shape of a region extending across a plurality of active regions and overlapping with the plurality of active regions has a square or rectangular shape. Accordingly, stress applied when the mask sheet 15 is stretched can be made uniform, and the mask sheet 15 can be attached to the mask frame 11 with high accuracy.

In addition, since the valid portion does not need to correspond to the shape of the active region having the irregular-shape portion, commonality of the mask sheet 15 having the valid portion YA formed can be achieved between substrates with various external shapes.

Note that the notches and the corners each having the round shape as described above are merely examples of the shape of irregular-shape portion, and the irregular-shape portion may have other irregular shapes.

In addition, the display according to the first to fourth embodiments is not particularly limited, and is a display panel including a display element. The display element is a display element of which luminance and transmittance are controlled by an electric current, and examples of the electric current-controlled display element include an organic Electro Luminescence (EL) display provided with an Organic Light Emitting Diode (OLED), an EL display such as an inorganic EL display provided with an inorganic light emitting diode, and a QLED display provided with a Quantum Dot Light Emitting Diode (QLED).

Supplement

A vapor deposition mask according to a first aspect provides a vapor deposition mask configured to be used to vapor-deposit a vapor-deposition layer on each of pixels of a vapor target substrate provided with a plurality of active regions on which the pixels contributing to displaying are arranged, the vapor deposition mask including: a mask sheet provided with a valid portion extending across the plurality of active regions and including a plurality of vapor deposition holes formed to be arranged; and a plurality of hauling sheets configured to support the mask sheet, wherein the valid portion includes a first region and a second region, the first region has a shape corresponding to a shape of each of the plurality of active regions, and is provided for each of the plurality of active regions, and the second region defines a shape of the first region, and overlaps with the plurality of hauling sheets to cause a portion of the plurality of vapor deposition holes to be covered.

In the vapor deposition mask according to a second aspect, the plurality of hauling sheets may extend in a direction perpendicular to an extending direction of the valid portion.

In the vapor deposition mask according to a third aspect, the plurality of hauling sheets may be in contact with a second surface of the mask sheet located on an opposite side to a first surface facing the vapor target substrate.

In the vapor deposition mask according to a fourth aspect, a pitch at which a plurality of vapor deposition holes present in the second region are arranged may be an integral multiple of a pitch at which a plurality of vapor deposition holes present in the first region are arranged.

In the vapor deposition mask according to a fifth aspect, a pitch at which a plurality of vapor deposition holes present in the second region are arranged may be equal to a pitch at which a plurality of vapor deposition holes present in the first region are arranged.

In the vapor deposition mask according to a sixth aspect, a width between the first regions may be an integral multiple of a pitch of the plurality of vapor deposition holes.

In the vapor deposition mask according to a seventh aspect, the valid portion may be provided on all the mask sheet.

In the vapor deposition mask according to an eighth aspect, a region of the valid portion between hauling sheets located at both ends may have a constant width.

In the vapor deposition mask according to a ninth aspect, the mask sheet may include a region having a width gradually increasing outward in a region outside of the region of the valid portion having a constant width.

In the vapor deposition mask according to a tenth aspect, the mask sheet may gradually expand from a width at each of positions including both ends of the valid portion, toward a width at a position including a central portion of the valid portion.

In the vapor deposition mask according to an eleventh aspect, one side of the first region may include a notch protruding from the one side toward an interior direction of the first region, and the plurality of vapor deposition holes in a region located outside of the first region and surrounded by the notch may be covered with each of the plurality of hauling sheets.

A method for manufacturing a vapor deposition mask according to a twelfth aspect provides a method for manufacturing a vapor deposition mask configured to be used to vapor-deposit a vapor-deposition layer on each of pixels of a vapor target substrate provided with a plurality of active regions on which the pixels contributing to displaying are arranged, the method including: a vapor-deposition-hole forming step for forming a plurality of vapor deposition holes in a mask sheet and providing a valid portion extending across a plurality of the active regions; a hauling-sheet attachment step for attaching a plurality of hauling sheets to a mask frame; and a mask-sheet attachment step for attaching the mask sheet to the mask frame to cause the mask sheet to overlap with the plurality of hauling sheets and to be supported by the plurality of hauling sheets, and providing a first region and a second region in the valid portion, wherein the first region is a region having a shape corresponding to a shape of each of the plurality of active regions, and being provided for each of the plurality of active regions, and the second region is a region defining a shape of the first region, and overlapping with the plurality of hauling sheets to cause a portion of the plurality of vapor deposition holes to be covered.

In the method for manufacturing a vapor deposition mask according to a thirteenth aspect, a region of the valid portion between hauling sheets located at both ends may have a constant width.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

REFERENCE SIGNS LIST

1 Substrate
2 TFT substrate (vapor target substrate)
3 Active region
4 Frame-shaped bank
5 Sealing layer
6, 8 Inorganic film
7 Organic film
9 Organic EL display panel formation region
10 Vapor deposition mask
11 Mask frame
12 Covering sheet
13 Hauling sheet
13z Hauling sheets at both ends
14 Alignment sheet
15 Mask sheet
43 Display region
44 Frame region
70 Vapor deposition source
80 Light-emitting layer (vapor-deposition layer)
bk Pixel bank
YA1 First region of valid portion YA
YA2 Second region of valid portion YA

The invention claimed is:

1. A vapor deposition mask configured to be used to vapor-deposit a vapor-deposition layer on each of pixels of a vapor target substrate provided with a plurality of active regions on which the pixels contributing to displaying are arranged, the vapor deposition mask comprising:
   a mask sheet provided with a valid portion extending across the plurality of active regions and including a plurality of vapor deposition holes formed to be arranged; and
   a plurality of hauling sheets configured to support the mask sheet,
   wherein the valid portion includes a first region and a second region,
   the first region has a shape corresponding to a shape of each of the plurality of active regions, and is provided for each of the plurality of active regions,
   the second region defines a shape of the first region, and overlaps with the plurality of hauling sheets to cause a portion of the plurality of vapor deposition holes to be covered, and
   a region of the valid portion between hauling sheets located at both ends has a constant width,
   the mask sheet includes a region having a width gradually increasing outward in a region outside of the region of the valid portion having a constant width, and the region having the width gradually increasing outward overlaps with the plurality of hauling sheets.

2. The vapor deposition mask according to claim 1, wherein the plurality of hauling sheets extend in a direction perpendicular to an extending direction of the valid portion.

3. The vapor deposition mask according to claim 1, wherein the plurality of hauling sheets are in contact with a second surface of the mask sheet located on an opposite side to a first surface facing the vapor target substrate.

4. The vapor deposition mask according to claim 1, wherein a pitch at which a plurality of vapor deposition holes present in the second region are arranged is an integral multiple of a pitch at which a plurality of vapor deposition holes present in the first region are arranged.

5. The vapor deposition mask according to claim 1, wherein a width between the first regions is an integral multiple of a pitch of the plurality of vapor deposition holes.

6. The vapor deposition mask according to claim 1, further comprising:
at least one cover sheet which fills a gap between the mask sheet and an additional mask sheet adjacent to the mask sheet.

\* \* \* \* \*